(12) United States Patent
Anderson et al.

(10) Patent No.: US 7,259,420 B2
(45) Date of Patent: Aug. 21, 2007

(54) MULTIPLE-GATE DEVICE WITH FLOATING BACK GATE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,680

(22) Filed: Jul. 28, 2004

(65) Prior Publication Data

US 2006/0022253 A1    Feb. 2, 2006

(51) Int. Cl.
  *H01L 29/788* (2006.01)
(52) U.S. Cl. .............. 257/315; 257/316; 257/322; 257/E21.179; 257/E21.209; 438/267
(58) Field of Classification Search ........... 257/315, 257/316
  See application file for complete search history.

(56) References Cited

U.S. PATENT DOCUMENTS

| | | | |
|---|---|---|---|
| 5,266,509 A | | 11/1993 | Chen |
| 5,455,792 A | * | 10/1995 | Yi .................. 365/185.15 |
| 6,107,141 A | * | 8/2000 | Hsu et al. ............ 438/267 |
| 6,465,836 B2 | | 10/2002 | Lin et al. |
| 6,518,123 B2 | | 2/2003 | Lin |
| 6,580,119 B1 | | 6/2003 | Hsieh |
| 6,624,032 B2 | | 9/2003 | Alavi et al. |
| 2003/0134435 A1 | | 7/2003 | Chan et al. |
| 2005/0242391 A1 | * | 11/2005 | She et al. ............. 257/324 |

OTHER PUBLICATIONS http://en.wikipedia.org/wiki/Floating_gate_transistor.*

* cited by examiner

*Primary Examiner*—Andy Huynh
*Assistant Examiner*—Dao H. Nguyen
(74) *Attorney, Agent, or Firm*—Gibb & Rahman, LLC; William D. Sabo, Esq.

(57) ABSTRACT

Disclosed is a multiple-gate transistor that includes a channel region and source and drain regions at ends of the channel region. A gate oxide is positioned between a logic gate and the channel region and a first insulator is formed between a floating gate and the channel region. The first insulator is thicker than the gate oxide. The floating gate is electrically insulated from other structures. Also, a second insulator is positioned between a programming gate and the floating gate. Voltage in the logic gate causes the transistor to switch on and off, while stored charge in the floating gate adjusts the threshold voltage of the transistor. The transistor can comprise a fin-type field effect transistor (FinFET), where the channel region comprises the middle portion of a fin structure and the source and drain regions comprise end portions of the fin structure.

21 Claims, 15 Drawing Sheets

MULTIPLE-GATE DEVICE WITH FLOATING BACK GATE

BACKGROUND ART

1. Field of the Invention

The invention generally relates to transistors and more particularly to a multiple-gate transistor that has a logic gate on one side of a channel region, and a floating gate and programming gate on the other side of the channel region.

2. Description of the Related Art

The size of transistors is being continually reduced so as to increase speed and decrease the size of devices that utilize transistors. Scaling is a term that describes this continual reduction in the size of transistors. Scaling of complementary metal oxide semiconductor (CMOS) devices has pushed integrated circuits to the limits of power that can be supplied to the device. A significant aspect of this power crisis is due to subthreshold leakage in field effect transistors (FETs). Variations in threshold voltage (Vt) among FETs within a die severely limits the speed that can be manufactured. The present invention provides a means of adjusting the Vt of individual FETs in a die post manufacturing process and structure.

SUMMARY OF THE INVENTION

The invention provides a multiple-gate transistor that includes a channel region and source and drain regions at ends of the channel region. A gate oxide is positioned between a logic gate and the channel region and a first insulator is formed between a floating gate and the channel region. The first insulator is thicker than the gate oxide. The floating gate is electrically insulated from other structures. Also, a second insulator is positioned between a programming gate and the floating gate. Voltage in the logic gate causes the transistor to switch on and off, while voltage in the programming gate adjusts the threshold voltage of the transistor. The transistor can comprise a fin-type field effect transistor (FinFET), where the channel region comprises the middle portion of a fin structure and the source and drain regions comprise end portions of the fin structure.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
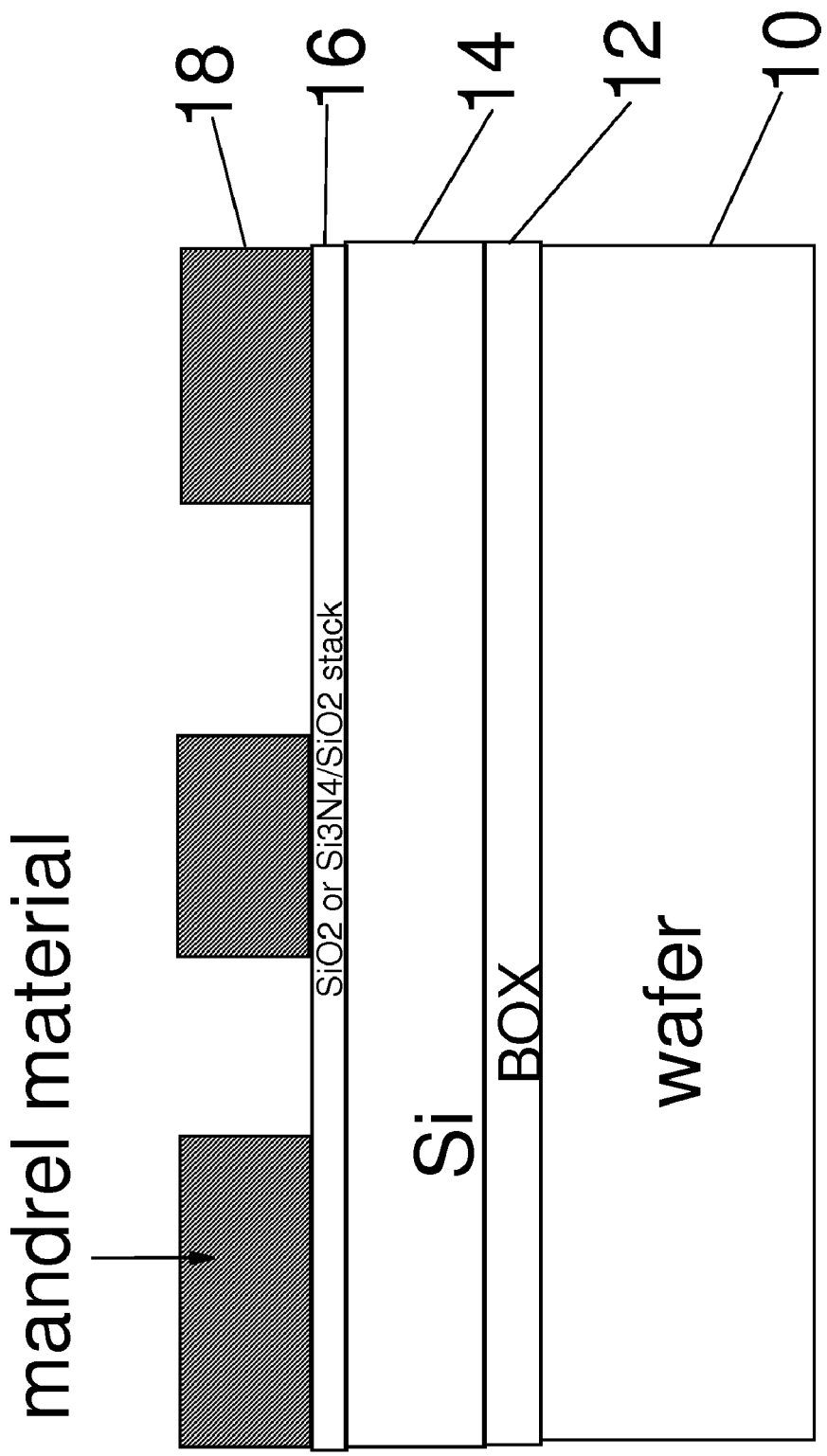
FIG. 1 is a schematic diagram of a cross-section of a partially completed transistor.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

In order to provide increased control over threshold voltage and thereby help solve the power crisis occurring in integrated circuits, the invention presents a double gate transistor, wherein a first gate is an ordinary gate with a thin oxide for logic or other circuit use, and a second gate comprises a stacked floating gate. After a diagnostic test, it is determined which devices have Vt too high (slow) or too low (leaky). The floating gates are then programmed according to need to provide a chip with higher performance and lower power. More specifically, by providing a high voltage to the programming gate, the charge in the floating gate can be changed through either tunneling of electrons from the drain to the floating gate, or, alternatively, if a high drain voltage is also provided, through injection of channel hot electrons at the drain edge. In other words, carriers flow to the floating gate through the insulator that separates the drain from the floating gate. Charge within the floating gate creates field lines that cross the channel region, which changes the threshold voltage of the transistor itself. Therefore, by altering the charge of the floating gate, the threshold voltage of the transistor can be increased or decreased. A wiring network as either implanted lines in the substrate or buried interconnects in the BOX can be used as a programming grid for the floating gates.

While one ordinarily skilled in the art would understand that the invention can be embodied within a number of different types of transistors, including fin-type field effect transistors (FinFETs), planar transistors, vertical transistors, etc., FIGS. 1-14 illustrates one example of the invention embodied in a FinFET transistor. More specifically, FIG. 1 illustrates a substrate wafer 10, buried oxide (box) insulator structure 12, a silicon layer 14, an insulator (such as SiO2, or Si3N4/SiO2 stack etc.), and a mandrel 18. Many different processes can be used to form the structure shown in FIG. 1, as would be understood by one ordinarily skilled in this art field, and a detailed discussion of the same is avoided for brevity.

Figure 2:
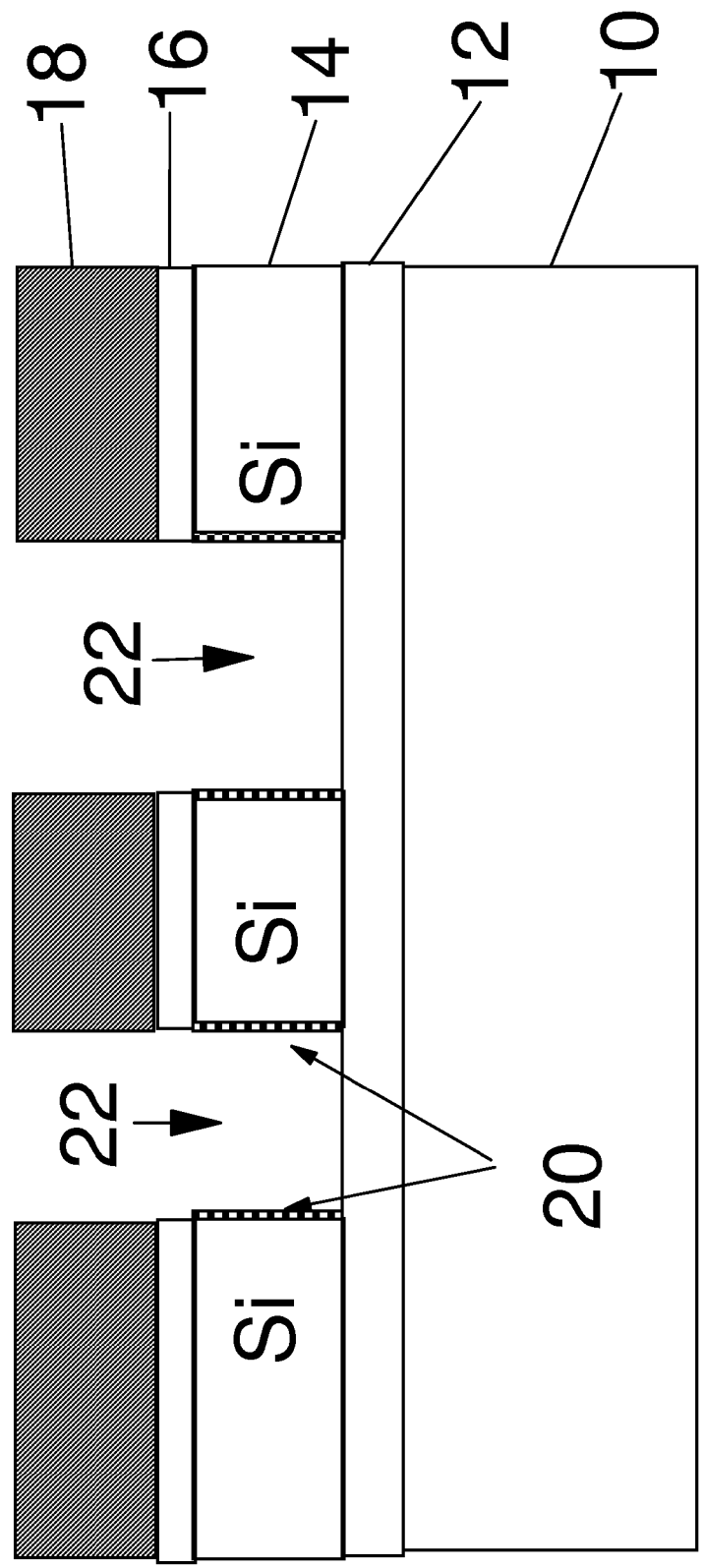
FIG. 2 is a schematic diagram of a cross-section of a partially completed transistor.
Figure 3:
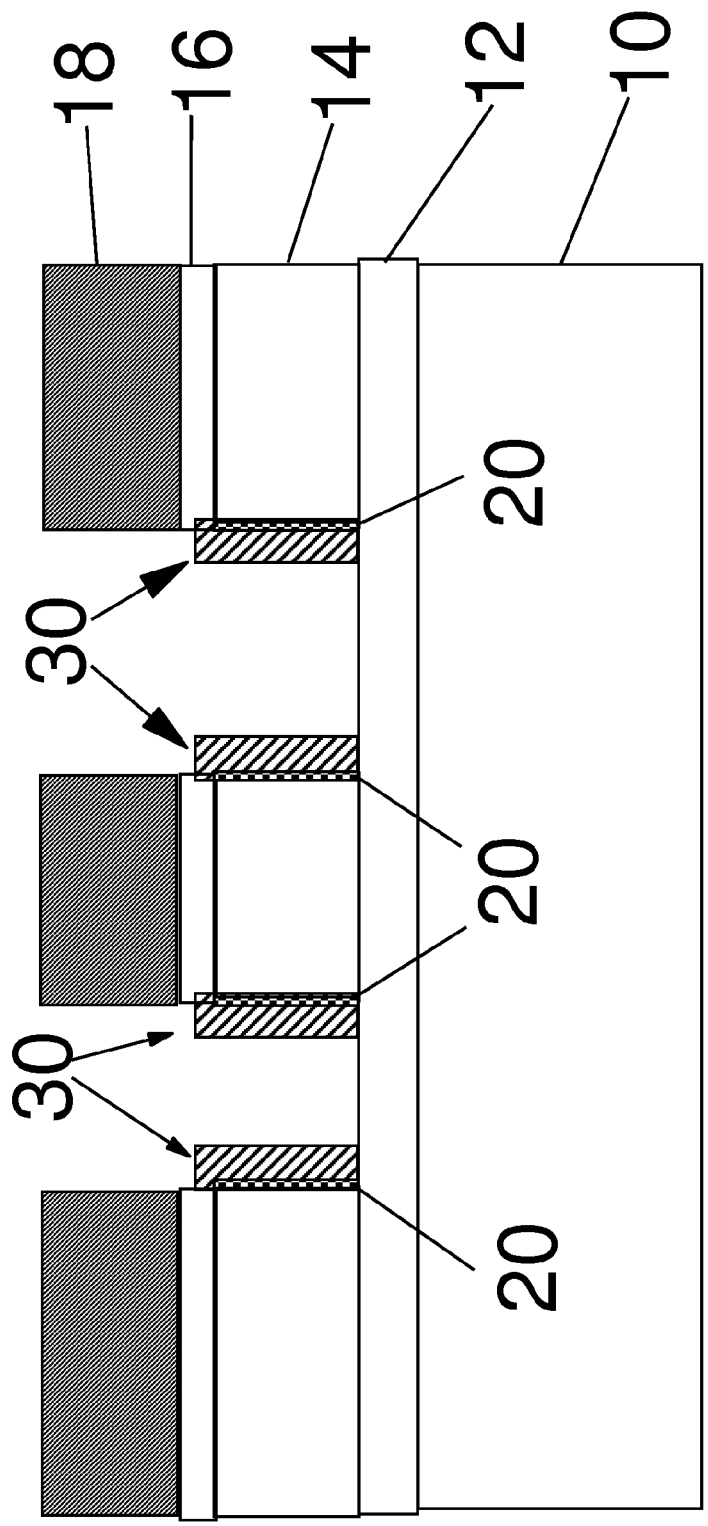
FIG. 3 is a schematic diagram of a cross-section of a partially completed transistor.
Figure 4:
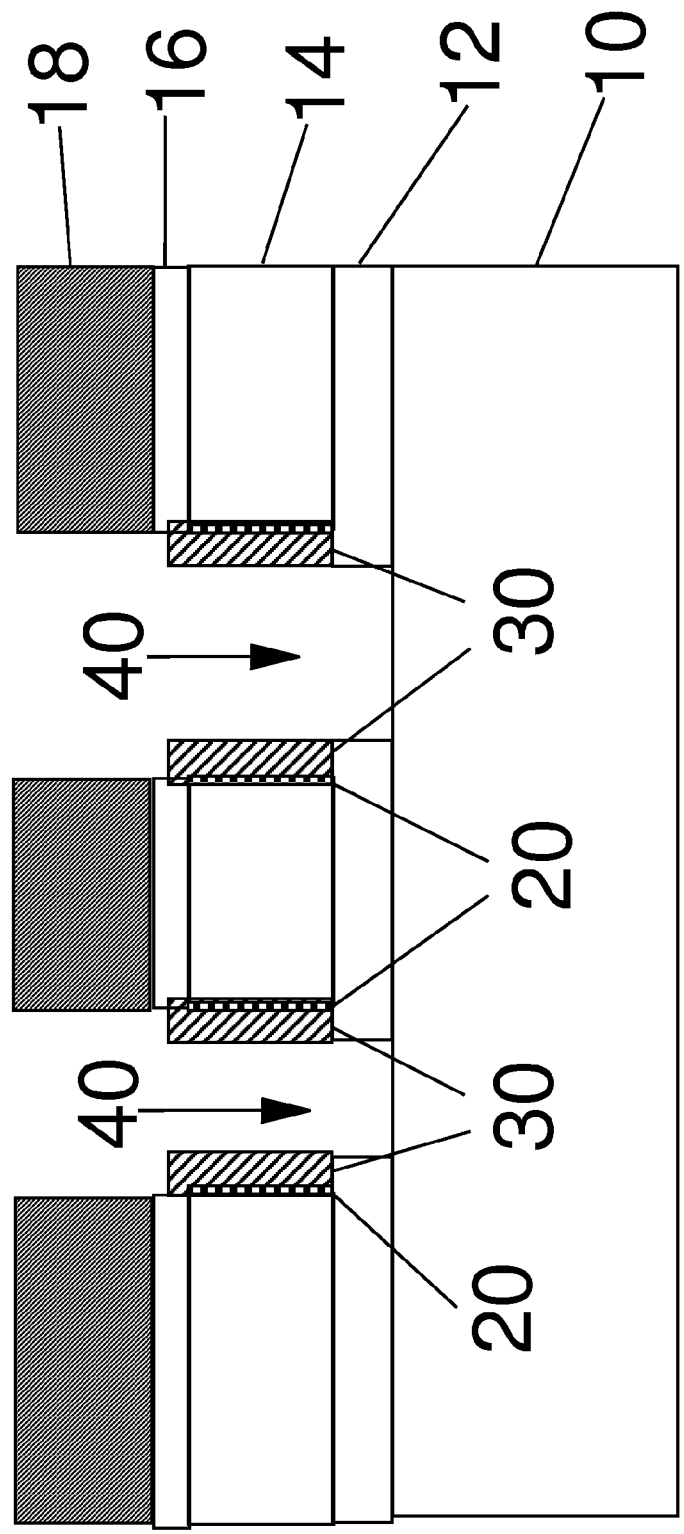
FIG. 4 is a schematic diagram of a cross-section of a partially completed transistor.
Figure 5:
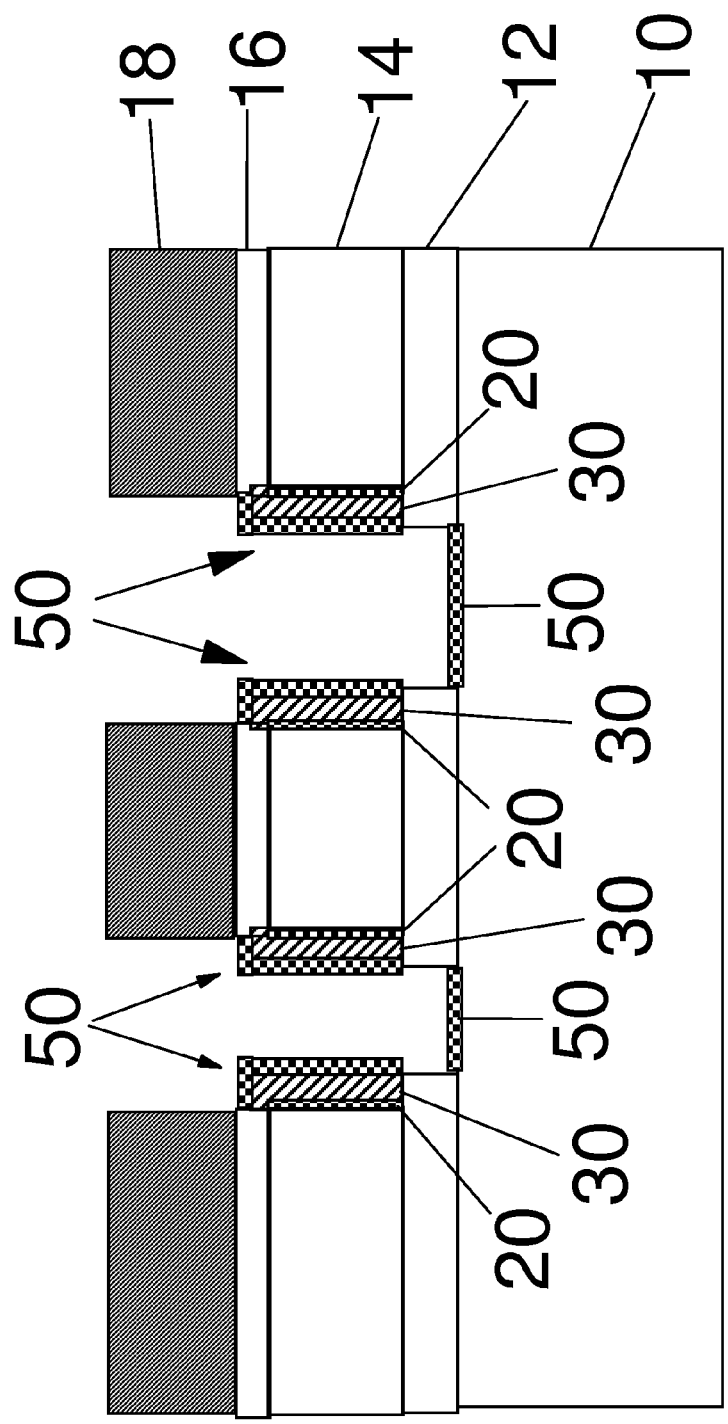
FIG. 5 is a schematic diagram of a cross-section of a partially completed transistor.

In FIG. 2, the invention etches through the insulator 16 and silicon 14 stopping on the oxide layer 12 to create openings 22. This can comprise a single etching process or multiple etching processes. After these openings are created, an oxide 20 is grown on the sides of the exposed silicon 14 using, for example, any conventional oxide formation process, such as thermal oxidation. Next, in FIG. 3, a conductor 30 (such as polysilicon or some other common conductor) is deposited and then selected removed in, for example, any common spacer formation technique. For example, when forming sidewall spacers, material is generally deposited and then removed in a directional etch (e.g., anisotropic etching) that removes material from horizontal surfaces at a faster rate than it removes the material from vertical surfaces, which leaves the material only on the sidewalls of the various structures. This forms conductive spacers 30 on the insulator 20, as shown in FIG. 3. An additional etching process then removes portions of the buried oxide layer 12, stopping on the wafer material 10 as shown in FIG. 4.

Figure 6:
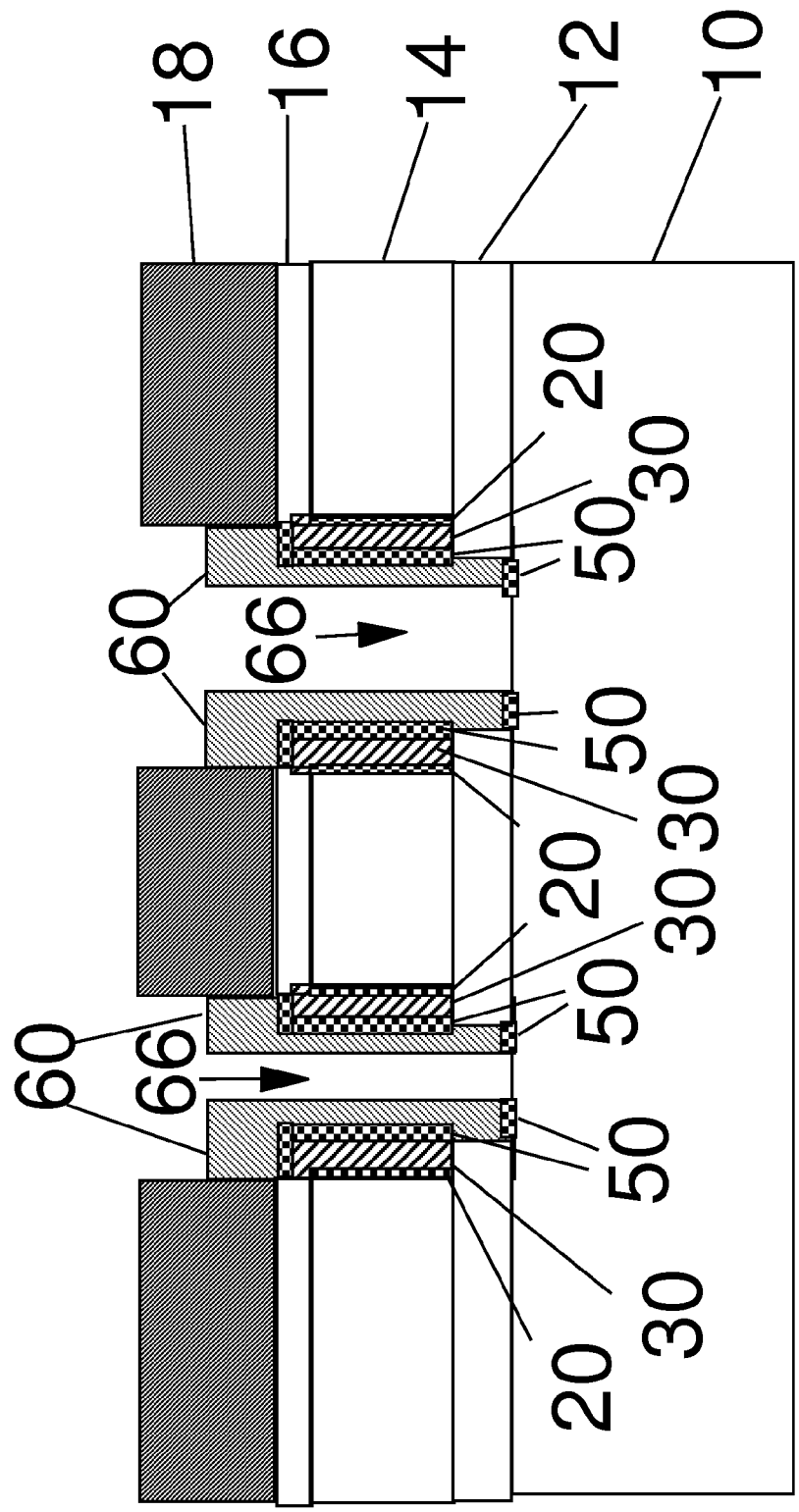
FIG. 6 is a schematic diagram of a cross-section of a partially completed transistor.

In FIG. 5, the invention again forms insulators 50 on the exposed area of the wafer and conductor 30. Once again, this insulator 50 can be any common insulator (such as SiO2, or Si3N4/SiO2 stack etc.) and is grown using any of a number of techniques well-known to those ordinarily skilled in this art field. In FIG. 6, another conductor 60 (polysilicon or any well-known conductor) is deposited. Then, the center portion 66 is removed in a selective etching process which extends through the insulator 50 down to the wafer 10.

Figure 7:
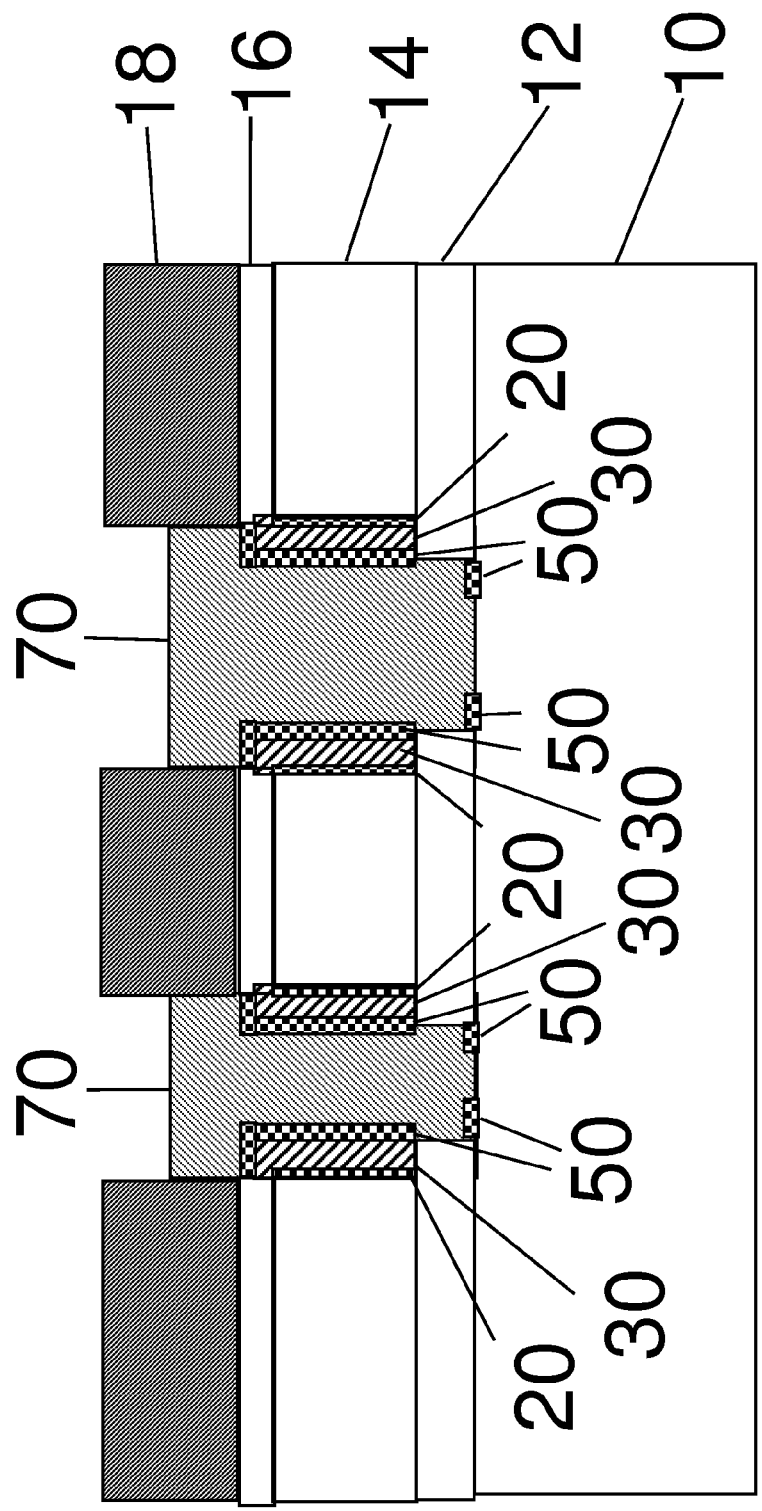
FIG. 7 is a schematic diagram of a cross-section of a partially completed transistor.
Figure 8:
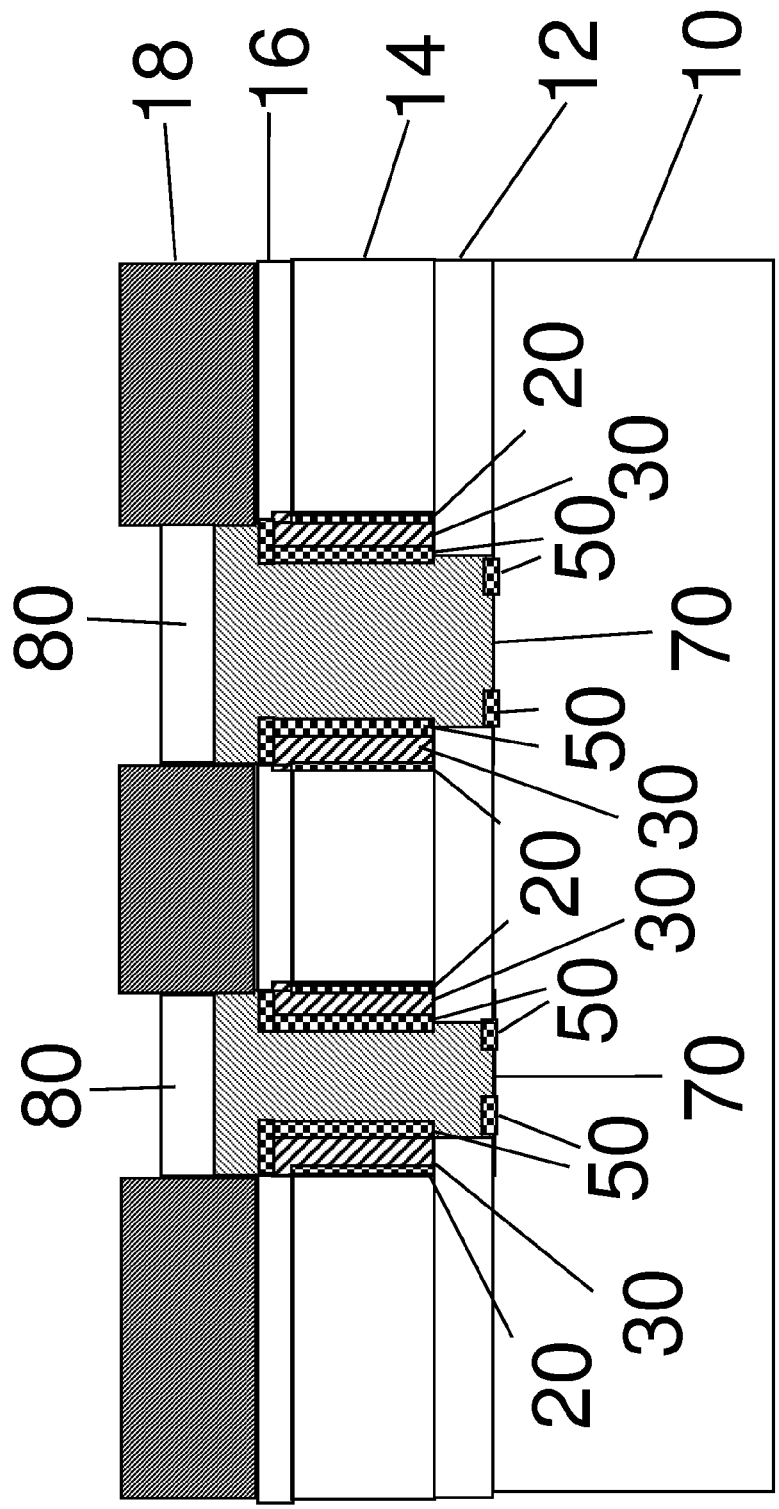
FIG. 8 is a schematic diagram of a cross-section of a partially completed transistor.
Figure 9:
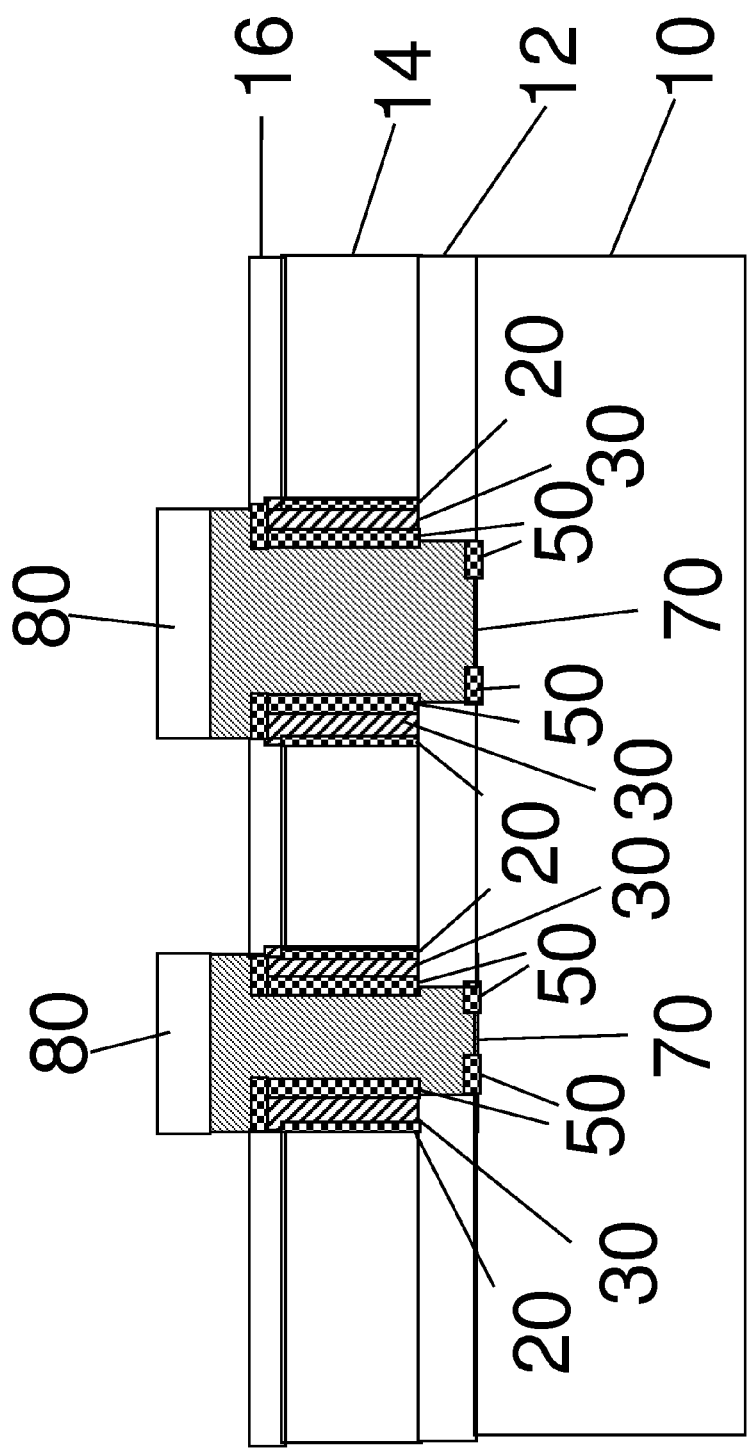
FIG. 9 is a schematic diagram of a cross-section of a partially completed transistor.
Figure 10:
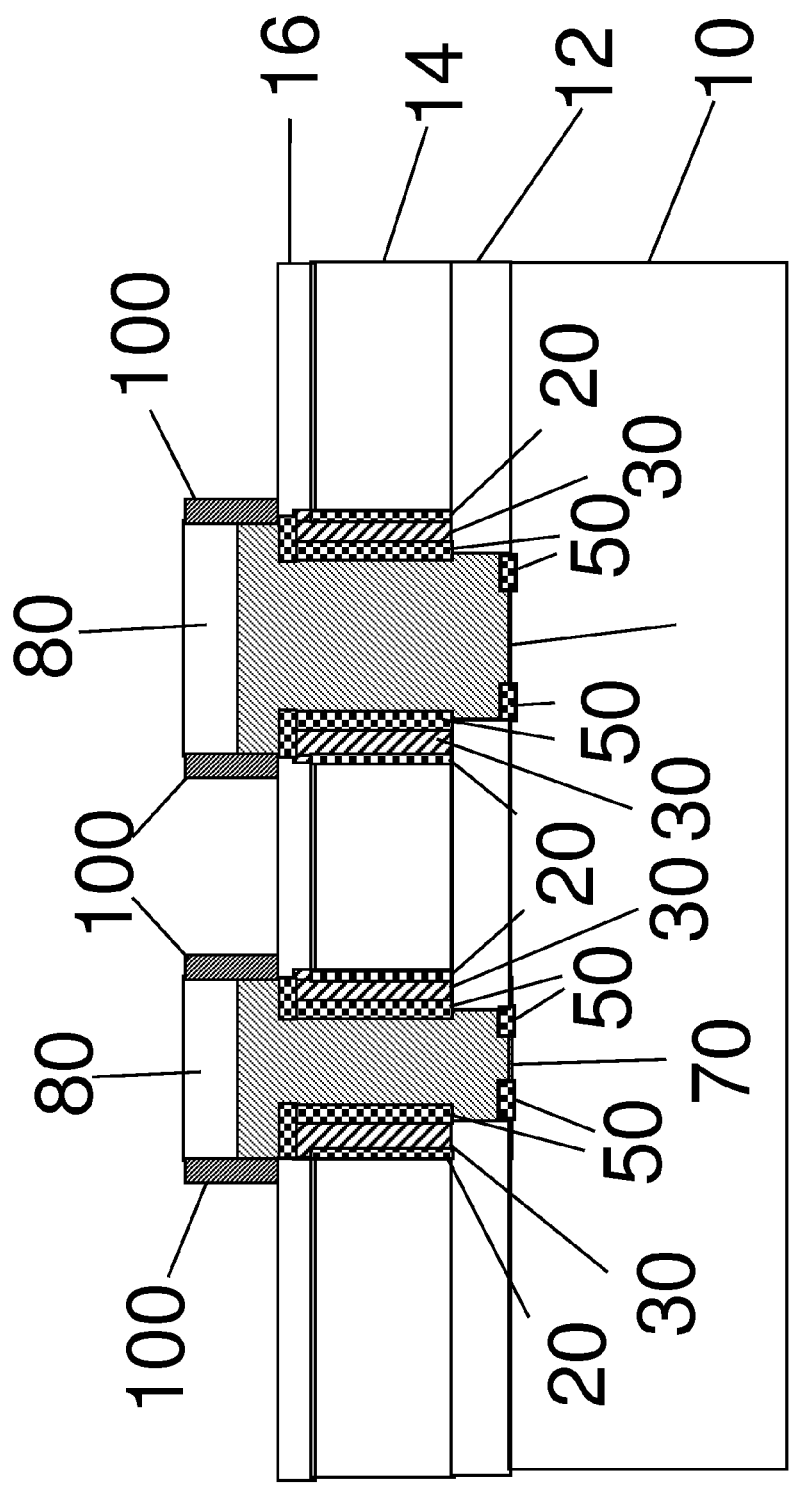
FIG. 10 is a schematic diagram of a cross-section of a partially completed transistor.

As shown in FIG. 7, additional conductive material 70 is deposited over the previous conductor material 60 and in the opening 66. In FIG. 8, an insulator 80 is formed, again using well-known processes. Then, in FIG. 9, the mandrel material 18 is removed using a selective removal processing such as etching. In FIG. 10, masking spacers 100 are formed on the exposed portions of the conductors 70 and insulator 80 using any sidewall spacer formation technique, such as those discussed above.

Figure 11:
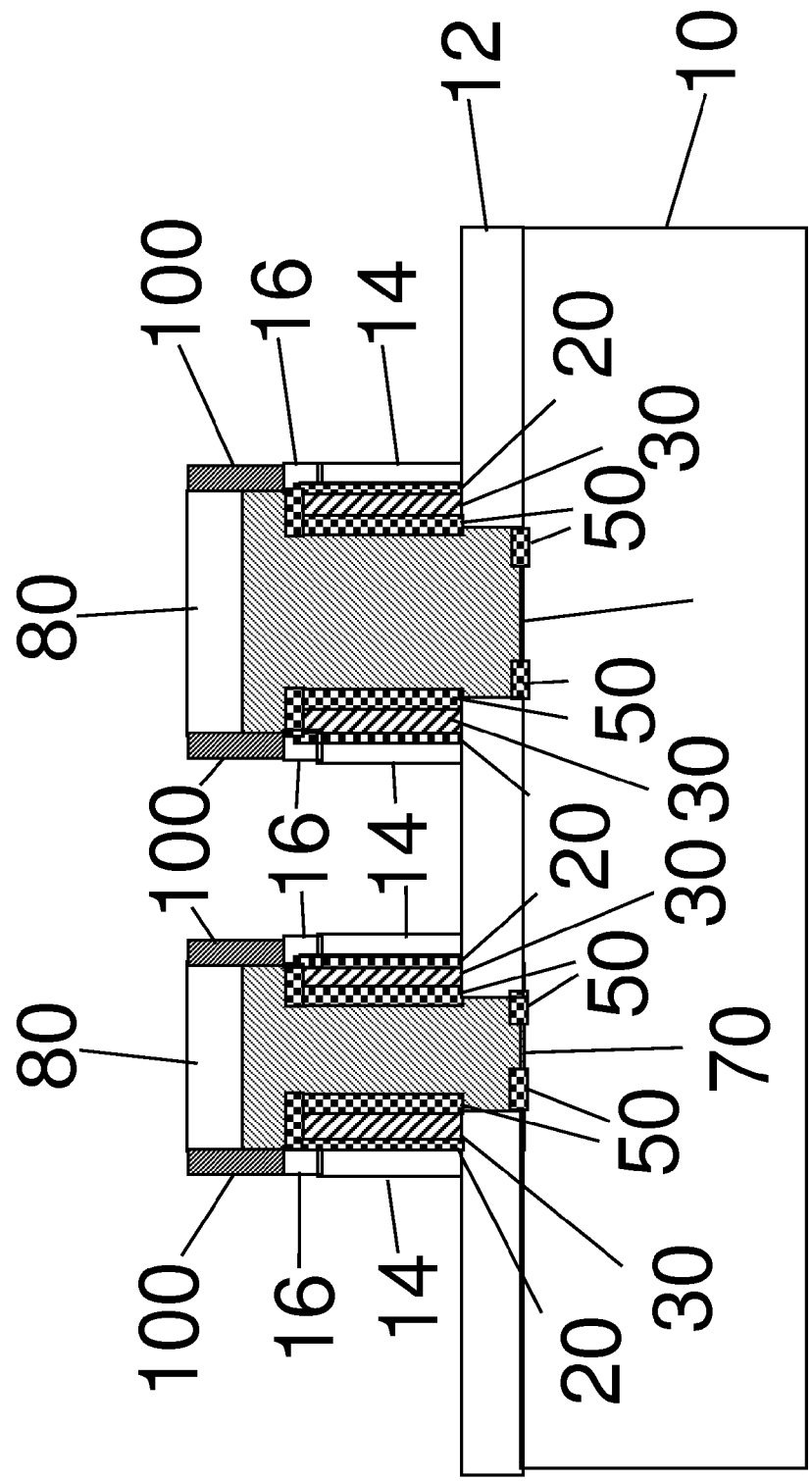
FIG. 11 is a schematic diagram of a cross-section of a partially completed transistor.
Figure 12:
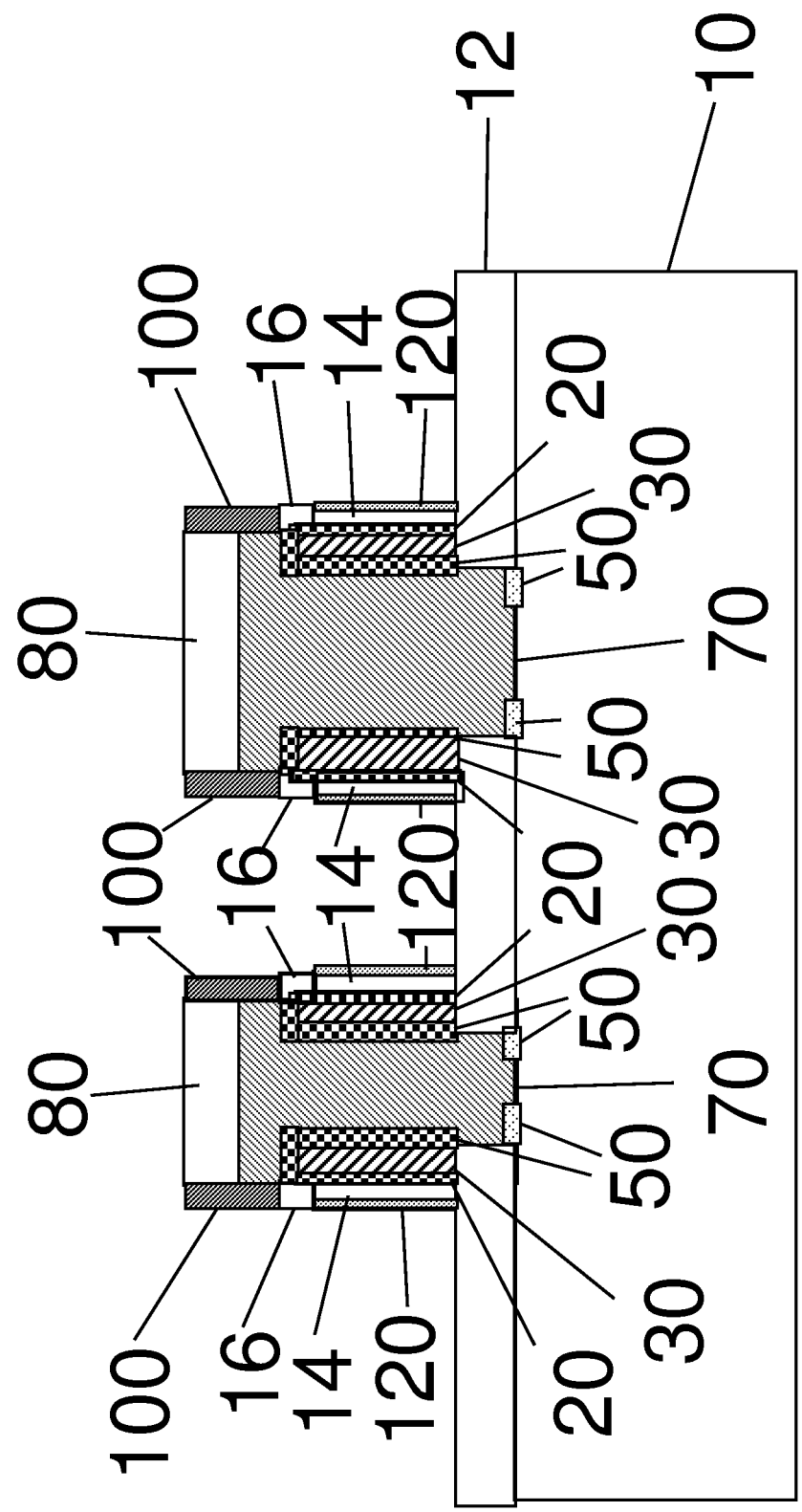
FIG. 12 is a schematic diagram of a cross-section of a partially completed transistor.
Figure 13:
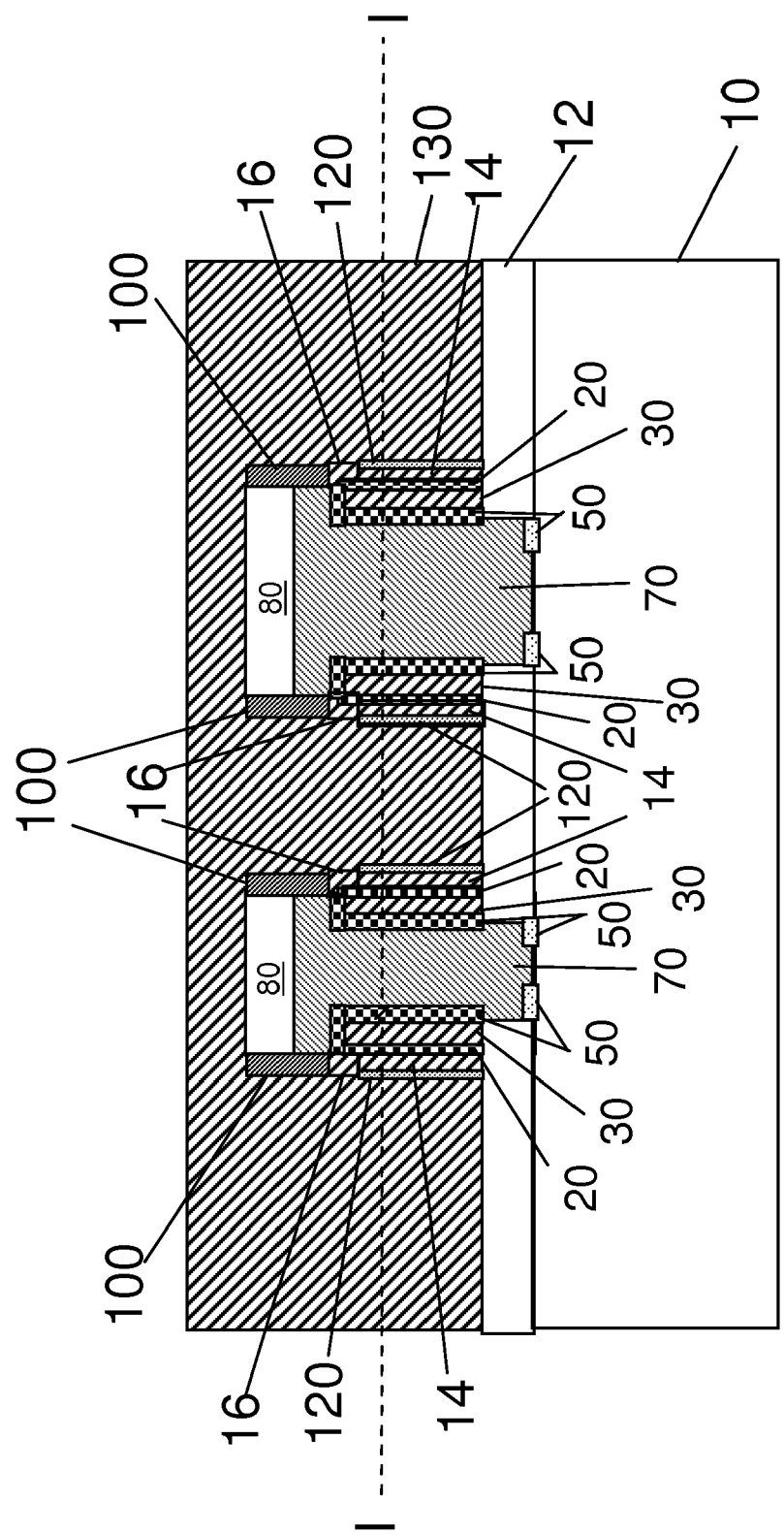
FIG. 13 is a schematic diagram of a cross-section of a partially completed transistor.
Figure 14:
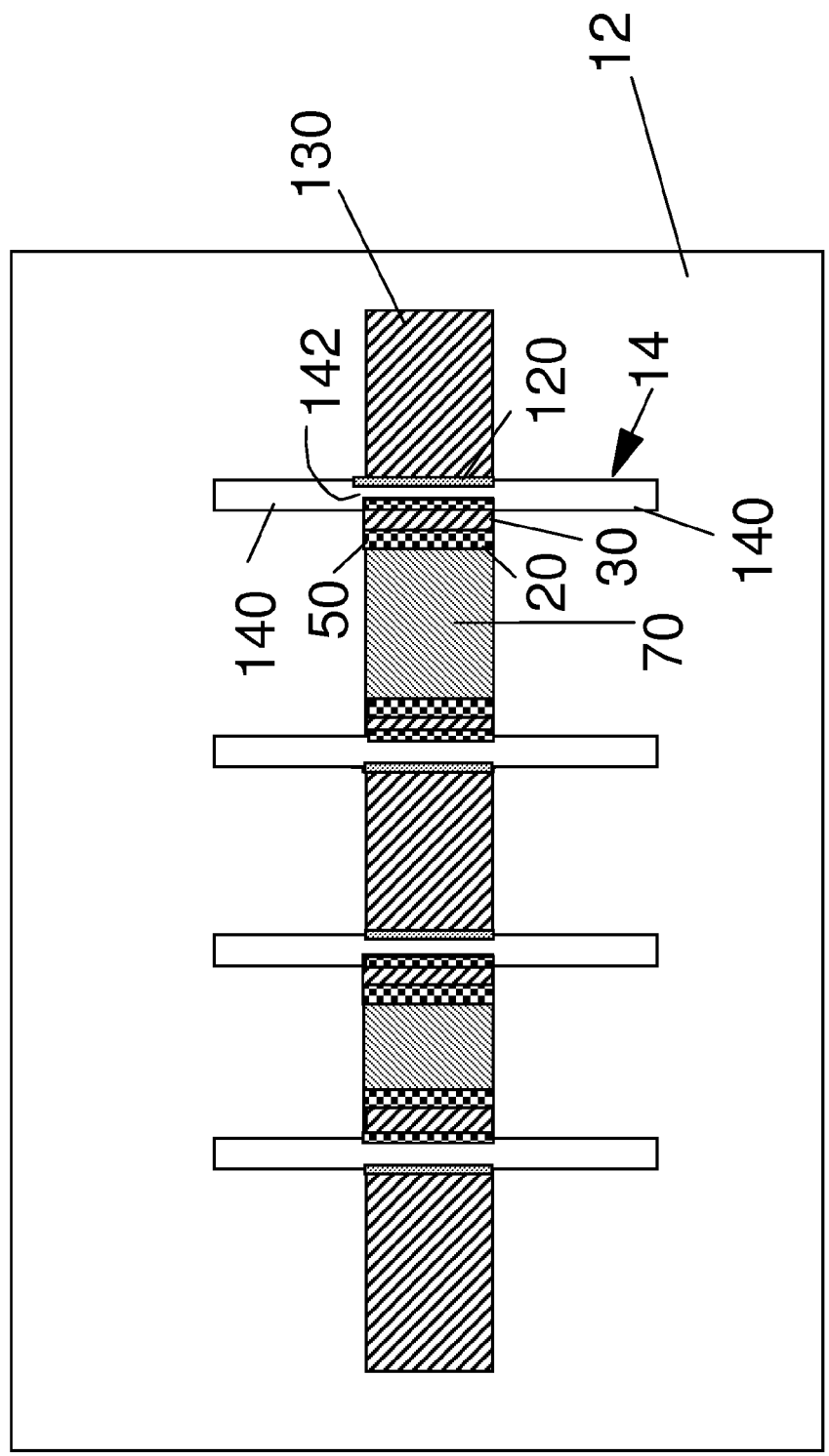
FIG. 14 is a schematic diagram of a cross-section of a partially completed transistor.

In FIG. 11, an etching process is used to remove portions of the silicon 14 and insulator 16. This processing forms the silicon 14 into fin structures, which can be seen more clearly in the top-view shown in FIG. 14. Next, in FIG. 12, an insulator 120 is grown on the exposed portions of the silicon 14. In FIG. 13, the gate material 130 is deposited over the entire structure and subsequently patterned. Note that the floating gate 30 and the programming gate 70 are also patterned simultaneously with the logic gate 130. FIG. 14 shows a top view of the structure shown along line I-I in FIG. 13, with the gate conductor 130 patterned over the center portion of the silicon fin 14. The center portion of the silicon fin 142 comprises a channel region, while the ends 140 of the silicon fin 14 are doped to comprise source and drain regions.

FIGS. 13 and 14 show the resulting structure which is a multiple-gate transistor that includes a channel region 142 and source and drain regions 140 at ends of the channel region 142. A gate oxide 120 is positioned between a logic gate 130 and the channel region 142 and a first insulator 20 is formed between a floating gate 30 and the channel region 142. The first insulator 20 is thicker than the gate oxide 120. The floating gate 30 is electrically insulated from other structures. Also, a second insulator 50 is positioned between the programming gate 70 and the floating gate 30. Voltage in the logic gate 130 causes the transistor to switch on and off, while charge in the floating gate 30 adjusts the threshold voltage of the transistor.

Figure 15:
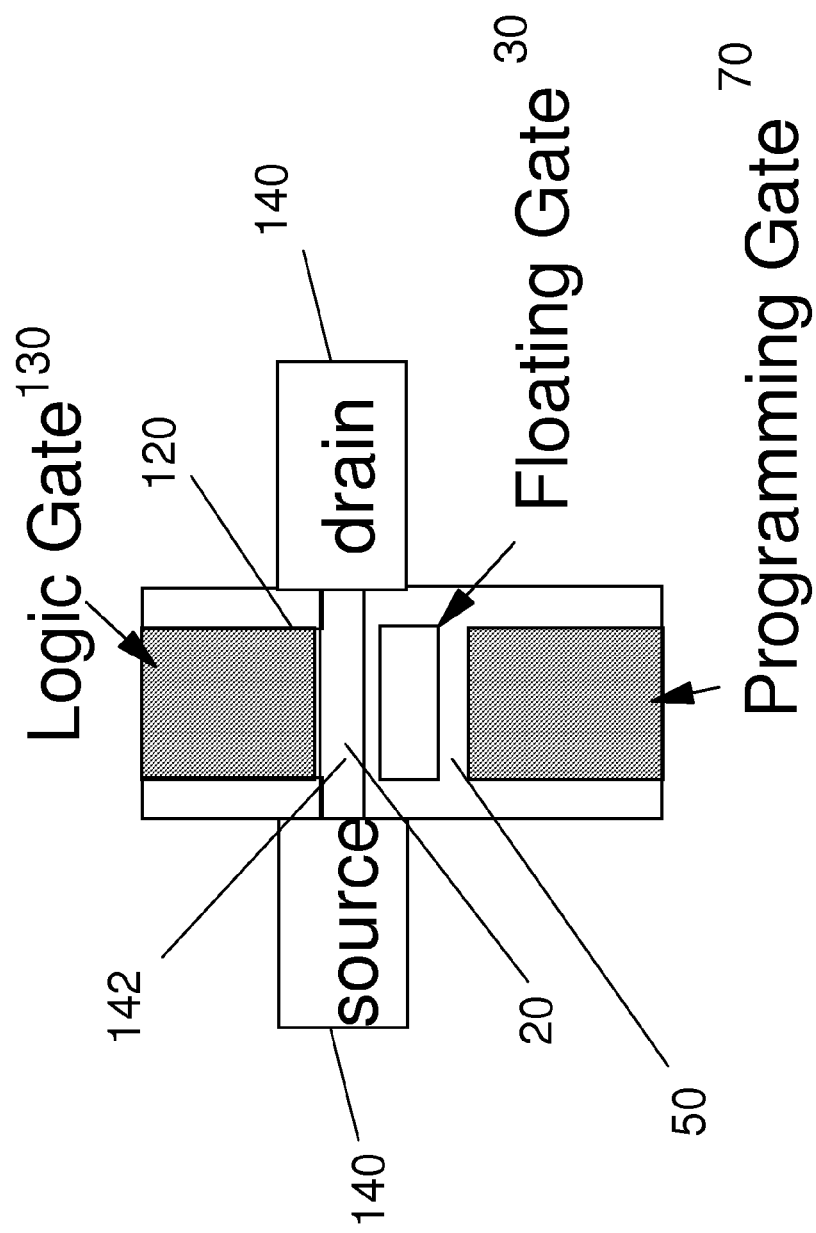
FIG. 15 is a top view of a cross-section of a partially completed transistor.

As shown in FIG. 14, the transistor can comprises a fin-type field effect transistor (FinFET), where the channel region 142 comprises the middle portion of a fin structure 14 and the source and drain regions 142 comprise end portions of the fin structure 14. Alternatively, the invention can comprise any type of transistor as shown in the schematic in FIG. 15. The structure includes the logic gate 130, source and drain 140, channel region 142, the oxide 120, insulators 20 and 50, floating gate 30, and programming gate 70 that are discussed above. This type of transistor can comprise a planar field effect transistor, vertical field effect transistor, or any other similar type of transistor.

As mentioned above, by changing the voltage of the programming gate 70, the voltage in the floating gate 30 is correspondingly changed, allowing the transfer of charge to or from the floating gate. In other words, carriers migrate from the drain 14 to the floating gate 30 through the insulator 20 that separates a portion of the drain 14 from the floating gate 30. Charge stored on the floating gate 30 creates field lines that cross the channel region 142, which changes the threshold voltage of the transistor itself. Therefore, by altering the charge of the floating gate 30, the threshold voltage of the transistor can be increased or decreased. This allows the floating gates to be programmed according to the need to provide a chip with higher performance and lower power consumption.

As a result of this invention, circuits with smaller delay and lower leakage can be produced. Specifically, leakages of transistors, or groups of transistors, can be adjusted according to need after fabrication of a semiconductor device, for example, to reduce leakage where there is more than adequate speed of some circuits, by increasing the threshold voltages of the selected, fast, devices. Similarly, if speed is determined to be lacking for some transistors, the threshold voltages of those transistors can be decreased to increase the drive strength of those transistors. The functionality of some some circuits is critically dependent on specific relationships, for instance, ratios of drive strengths of the FETs within an 6T SRAM Cell; these circuits can further derive the benefits of improved process yield by adjusting sets of FETs as needed to restore the required relationships of threshold voltages or drive strengths in circuits that would otherwise fail due to as-fabricated mismatches.

While the invention has been described in terms of preferred embodiments, those skilled in the art will recognize that the invention can be practiced with modification within the spirit and scope of the appended claims.

The invention claimed is:

1. A multiple-gate transistor comprising:
   a channel region;
   a logic gate comprising a conductor adjacent a first side of said channel region;
   a floating gate comprising a conductor adjacent a second side of said channel region, wherein said first side is opposite said second side such that said channel region is between said first side and said second side, and wherein said channel region is between said floating gate and said logic gate; and a programming gate comprising a conductor adjacent said floating gate, wherein said floating gate is between said programming gate and said channel region, wherein said logic gate performs a different function than said floating gate, wherein said logic gate performs a different function than said programming gate, and wherein said floating gate performs a different function than said programming gate.

2. The transistor in claim 1, further comprising a gate oxide between said channel region and said logic gate and a first insulator between said channel region and said floating gate, wherein said first insulator is thicker than said gate oxide.

3. The transistor in claim 1, wherein voltage in said logic gate causes said transistor to switch on and off.

4. The transistor in claim 1, wherein charge in said floating gate adjusts the threshold voltage of said transistor.

5. The transistor in claim 1, wherein said transistor comprises a fin-type field effect transistor (FinFET).

6. The transistor in claim 1, further comprising source and drain regions at ends of said channel region, wherein said channel region comprises the middle portion of a fin structure and said source and drain regions comprise end portions of said fin structure.

7. The transistor in claim 1, wherein said floating gate is electrically insulated from other structures.

8. A multiple-gate transistor comprising:
a channel region;
source and drain regions at ends of said channel region;
a gate oxide on a first side of said channel region;
a logic gate comprising a conductor adjacent said first gate oxide, wherein said gate oxide is between said logic gate and said channel region, and wherein voltage in said logic gate causes said transistor to switch on and off;
a first insulator on a second side of said channel region, wherein said second side of said channel region is opposite said first side such that said channel region is between said first side and said second side;
a floating gate comprising a conductor adjacent said first insulator, wherein said first insulator is between said floating gate and said channel region, wherein said channel region is between said floating gate and said logic gate, and wherein charge in said floating gate adjusts the threshold voltage of said transistor;
a second insulator adjacent said floating gate; and
a programming gate comprising a conductor adjacent said second insulator, wherein said second insulator is between said programming gate and said floating gate, wherein a voltage change of said programming gate changes a voltage of said floating gate,
wherein said logic gate performs a different function than said floating gate, wherein said logic gate performs a different function than said programming gate, and wherein said floating gate performs a different function than said programming gate.

9. The transistor in claim 8, wherein said first insulator is thicker than said gate oxide.

10. The transistor in claim 8, wherein said transistor comprises a fin-type field effect transistor (FinFET).

11. The transistor in claim 8, wherein said channel region comprises the middle portion of a fin structure and said source and drain regions comprise end portions of said fin structure.

12. The transistor in claim 8, wherein said floating gate is electrically insulated from other structures.

13. A multiple-gate transistor comprising:
a channel region;
a logic gate comprising a conductor adjacent a first side of said channel region, wherein voltage in said logic gate causes said transistor to switch on and off;
a floating gate comprising a conductor adjacent a second side of said channel region, wherein said first side is opposite said second side such that said channel region is between said first side and said second side, wherein said channel region is between said floating gate and said logic gate, and wherein charge in said floating gate adjusts the threshold voltage of said transistor; and
a programming gate comprising a conductor adjacent said floating gate, wherein said floating gate is between said programming gate and said channel region.

14. The transistor in claim 13, further comprising a gate oxide between said channel region and said logic gate and a first insulator between said channel region and said floating gate, wherein said first insulator is thicker than said gate oxide.

15. The transistor in claim 13, wherein said transistor comprises a fin-type field effect transistor (FinFET).

16. The transistor in claim 13, further comprising source and drain regions at ends of said channel region, wherein said channel region comprises the middle portion of a fin structure and said source and drain regions comprise end portions of said fin structure.

17. The transistor in claim 13, wherein said floating gate is electrically insulated from other structures.

18. A multiple-gate transistor comprising:
a channel region;
a logic gate comprising a conductor adjacent a first side of said channel region, wherein voltage in said logic gate causes said transistor to switch on and off, and wherein said transistor comprises a fin-type field effect transistor (FinFET);
a floating gate comprising a conductor adjacent a second side of said channel region, wherein said first side is opposite said second side such that said channel region is between said first side and said second side, wherein said channel region is between said floating gate and said logic gate, and wherein charge in said floating gate adjusts the threshold voltage of said transistor; and
a programming gate comprising a conductor adjacent said floating gate, wherein said floating gate is between said programming gate and said channel region.

19. The transistor in claim 18, further comprising a gate oxide between said channel region and said logic gate and a first insulator between said channel region and said floating gate, wherein said first insulator is thicker than said gate oxide.

20. The transistor in claim 18, further comprising source and drain regions at ends of said channel region, wherein said channel region comprises the middle portion of a fin structure and said source and drain regions comprise end portions of said fin structure.

21. The transistor in claim 18, wherein said floating gate is electrically insulated from other structures.

* * * * *